US010510813B2

United States Patent
Son et al.

(10) Patent No.: US 10,510,813 B2
(45) Date of Patent: Dec. 17, 2019

(54) TRANSPARENT DISPLAY DEVICE

(71) Applicant: LG Display Co., Ltd., Seoul (KR)

(72) Inventors: Hyeon Ho Son, Paju-si (KR); Ji Young Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/853,764

(22) Filed: Dec. 23, 2017

(65) Prior Publication Data

US 2018/0190735 A1     Jul. 5, 2018

(30) Foreign Application Priority Data

Dec. 29, 2016   (KR) .......................... 10-2016-0182855

(51) Int. Cl.
*H01L 27/32*   (2006.01)
*H01L 51/52*   (2006.01)
(Continued)

(52) U.S. Cl.
CPC .......... *H01L 27/3232* (2013.01); *G02F 1/137* (2013.01); *G02F 1/1368* (2013.01); *G02F 1/13363* (2013.01); *G02F 1/133502* (2013.01); *G02F 1/133512* (2013.01); *G02F 1/133528* (2013.01); *H01L 27/322* (2013.01); *H01L 27/3267* (2013.01); *H01L 27/3272* (2013.01); *H01L 51/5281* (2013.01);
(Continued)

(58) Field of Classification Search
CPC ......... G02F 1/133502; G02F 1/133512; G02F 1/133528; G02F 1/13363; G02F 1/1368; G02F 1/137; G02F 2001/133638; G02F 2001/136222; G02F 2201/121; G02F 2201/123; G02F 2201/44; G02F 2201/52; G02F 2413/01; G02F 2413/05; G02F 2413/14; H01L 27/3232; H01L 27/322; H01L 27/3267; H01L 27/3272; H01L 51/5281; H01L 51/5293; H01L 27/3211; H01L 27/3218; H01L 27/326

See application file for complete search history.

(56) References Cited

U.S. PATENT DOCUMENTS

| | | |
|---|---|---|
| 2006/0119590 A1 | 6/2006 | Park et al. |
| 2009/0147186 A1 | 6/2009 | Nakai et al. |
| 2011/0013131 A1* | 1/2011 | Tanaka .............. G02F 1/133512 349/155 |
| 2011/0279749 A1 | 11/2011 | Erinjippurath et al. |
| 2012/0032175 A1 | 2/2012 | Wang et al. |
| 2013/0215095 A1 | 8/2013 | Shin et al. |

(Continued)

FOREIGN PATENT DOCUMENTS

| | | |
|---|---|---|
| CN | 101263417 A | 9/2008 |
| CN | 102971663 A | 3/2013 |

(Continued)

*Primary Examiner* — Nathanael R Briggs
(74) *Attorney, Agent, or Firm* — Polsinelli PC

(57) ABSTRACT

Disclosed is a transparent display device. The transparent display device includes a first display panel, including a transmissive area and an emissive area where a first pixel including a plurality of subpixels displaying an image is provided, and a second display panel including a second pixel provided to overlap the emissive area and the transmissive area of the first display panel, the second display panel being provided on a first surface of the first display panel. The second pixel of the second display panel controls an amount of light incident on the first display panel, thereby preventing a visibility of an image displayed by the first display panel from being reduced by external light.

17 Claims, 6 Drawing Sheets

(51) Int. Cl.
*G02F 1/1335* (2006.01)
*G02F 1/13363* (2006.01)
*G02F 1/1368* (2006.01)
*G02F 1/137* (2006.01)
*G02F 1/1362* (2006.01)

(52) U.S. Cl.
CPC .............. H01L 51/5293 (2013.01); *G02F 2001/133638* (2013.01); *G02F 2001/136222* (2013.01); *G02F 2201/121* (2013.01); *G02F 2201/123* (2013.01); *G02F 2201/44* (2013.01); *G02F 2201/52* (2013.01); *G02F 2413/01* (2013.01); *G02F 2413/05* (2013.01); *G02F 2413/14* (2013.01); *H01L 27/326* (2013.01); *H01L 27/3211* (2013.01); *H01L 27/3218* (2013.01)

(56) References Cited

U.S. PATENT DOCUMENTS

| | | | |
|---|---|---|---|
| 2013/0314647 | A1 | 11/2013 | Yim et al. |
| 2013/0328945 | A1* | 12/2013 | Kim ............ H01L 33/08 |
| | | | 345/690 |
| 2014/0185129 | A1* | 7/2014 | Kim ............ H01L 51/5284 |
| | | | 359/296 |
| 2016/0202812 | A1* | 7/2016 | Pyoun ............ G06F 3/0412 |
| | | | 345/173 |

FOREIGN PATENT DOCUMENTS

| | | |
|---|---|---|
| CN | 103258502 A | 8/2013 |
| TW | 200630925 A | 9/2006 |
| TW | 201211622 A1 | 3/2012 |

\* cited by examiner

TRANSPARENT DISPLAY DEVICE

CROSS-REFERENCE TO RELATED APPLICATION

This application claims the benefit of the Korean Patent Application No. 10-2016-0182855 filed on Dec. 29, 2016, which is hereby incorporated by reference in its entirety as if fully set forth herein.

BACKGROUND

Field of the Disclosure

The present disclosure relates to a display device, and more particularly, to a transparent display device which improves a contrast ratio and quality of an image displayed in an environment where external light is strongly incident.

Description of the Background

The display field of processing and displaying a massive amount of information has rapidly advanced. Correspondingly, various display devices have been developed and are attracting much attention.

Examples of the display devices include liquid crystal display (LCD) devices, plasma display panel (PDP) devices, field emission display (FED) devices, electroluminescence display (ELD) devices, organic light emitting diode (OLED) display devices, etc. Such display devices have attractive characteristics such as thinness, lightness, and low consumption power, and thus, the application fields of the display devices are continuously increasing. Particularly, in most electronic devices or mobile devices, the display devices are used as a type of user interface.

Moreover, transparent display devices which enable a user to look at a background or an object located behind the transparent display devices are being actively researched recently.

The transparent display devices have advantages in space availability, interior, and design and may be applied to various fields. The transparent display devices can realize an information recognition function, an information processing function, and an information display function by using a transparent electronic device, thereby solving the spatial limitation and visual limitation of electronic devices. For example, the transparent display devices may be applied to windows of buildings or vehicles and thus may be implemented as a smart window which allows the background to be seen or displays an image.

FIG. 1 is a schematic cross-sectional view of a related art transparent display device including an organic light emitting display device.

As illustrated in FIG. 1, the transparent display device includes an emissive area EA displaying an image and a transmissive area TA allowing light to transmit, and includes an anode electrode 2, an organic light emitting layer 3, a cathode electrode 4, an encapsulation layer 5, a color filter 6, an overcoat layer 7, and a second substrate 8, which are sequentially provided on a first substrate 1.

In the organic light emitting display device, the anode electrode 2, the organic light emitting layer 3, and the cathode electrode 4 are sequentially formed on the first substrate 1. When a driving power is applied to the anode electrode 2 and the cathode electrode 4, a hole and an electron are combined in the organic light emitting layer 3 to generate an exciton, and thus, an image is displayed by using light emitted from the organic light emitting layer 3. The anode electrode 2, the organic light emitting layer 3, and the cathode electrode 4 are provided in only the emissive area EA so as not to affect a transmittance of the transparent display device.

The encapsulation layer 5 is provided on the cathode electrode 4 to prevent external moisture from penetrating into the anode electrode 2, the organic light emitting layer 3, and the cathode electrode 4.

The color filter 6 is provided on the encapsulation layer 5 in each of a plurality of pixels. The color filter 6 is provided in only the emissive area EA so as not to affect a transmittance of the transparent display device.

Since the color filter 6 is provided in only the emissive area EA, the overcoat layer 7 is formed on the color filter 6 so as to planarize the first substrate 1, which is not planar.

The related art transparent display device including the organic light emitting display device has the following problems.

Generally, a transparent display device including the organic light emitting display device realizes red, brightness is about 200 nit, while it realizes black, brightness is about 0 nit. However, when a transparent display device included in vehicles or mobile devices is driven in an external environment exposed to sunlight, the sunlight having brightness of about 1,200 nit to 12,000 nit passes through the transparent display device via the transmissive area TA.

That is, when the related art transparent display device is used at an outdoor place, a contrast ratio (CR) is reduced by external light having illumination, which is much brighter than an image displayed by the transparent display device, and for this reason, it is difficult to recognize the displayed image.

SUMMARY

Accordingly, the present disclosure is directed to provide a transparent display device that substantially obviates one or more problems due to limitations and disadvantages of the related art.

An aspect of the present disclosure is directed to provide a transparent display device which completely blocks external light in a display mode of displaying an image through the transparent display device, thereby preventing a contrast ratio of the image from being reduced.

Another aspect of the present disclosure is directed to provide a transparent display device which further includes a separate display panel using external light, such as sunlight, as source light and thus increases luminance of red, green, blue, and white, thereby improving image quality.

Another aspect of the present disclosure is directed to provide a transparent display device which causes all of external light to be absorbed by the inside of the transparent display device, thereby preventing image quality from being reduced and preventing visibility from being reduced when realizing black.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a transparent display device including a first display panel, including a transmissive area and an emissive area where a first pixel including a plurality of subpixels displaying an image is provided, and a second display panel including a second pixel provided to overlap the emissive area and the transmissive area of the first display panel, the second display panel being provided on a first surface of the first display panel. The second pixel of the second display panel controls an amount of light incident on the first display panel, thereby preventing a visibility of an image displayed by the first display panel from being reduced by external light.

In another aspect of the present disclosure, there is provided a transparent display device including a transmissive area and an emissive area comprising a first display panel including a first pixel and displaying an image; and a second display panel including a second pixel, disposed on the first display panel, vertically overlapping the first display panel at the emissive area and the transmissive area, and configured to control an amount of light incident into the first display panel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of this disclosure, illustrate aspects of the disclosure and together with the description serve to explain the principle of the disclosure.

In the drawings.

DETAILED DESCRIPTION

Figure 1:
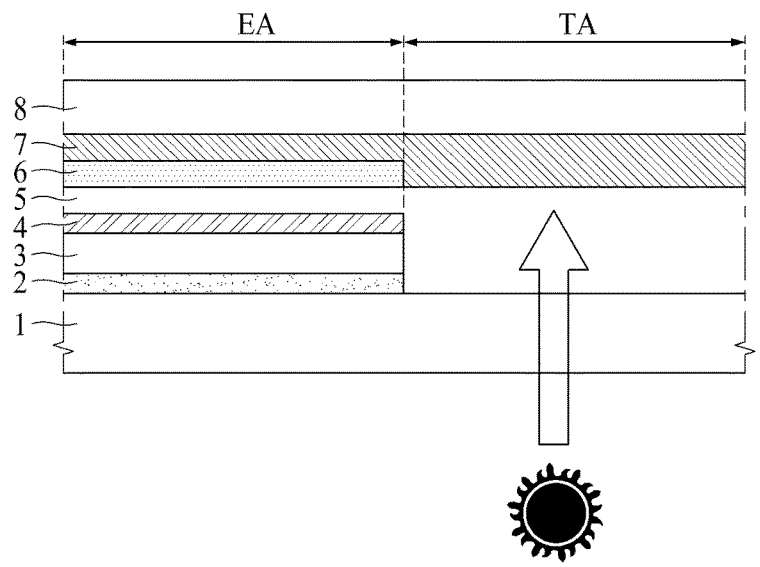
FIG. 1 is a schematic cross-sectional view of a related art transparent display device including an organic light emitting display device.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings.

Figure 2:
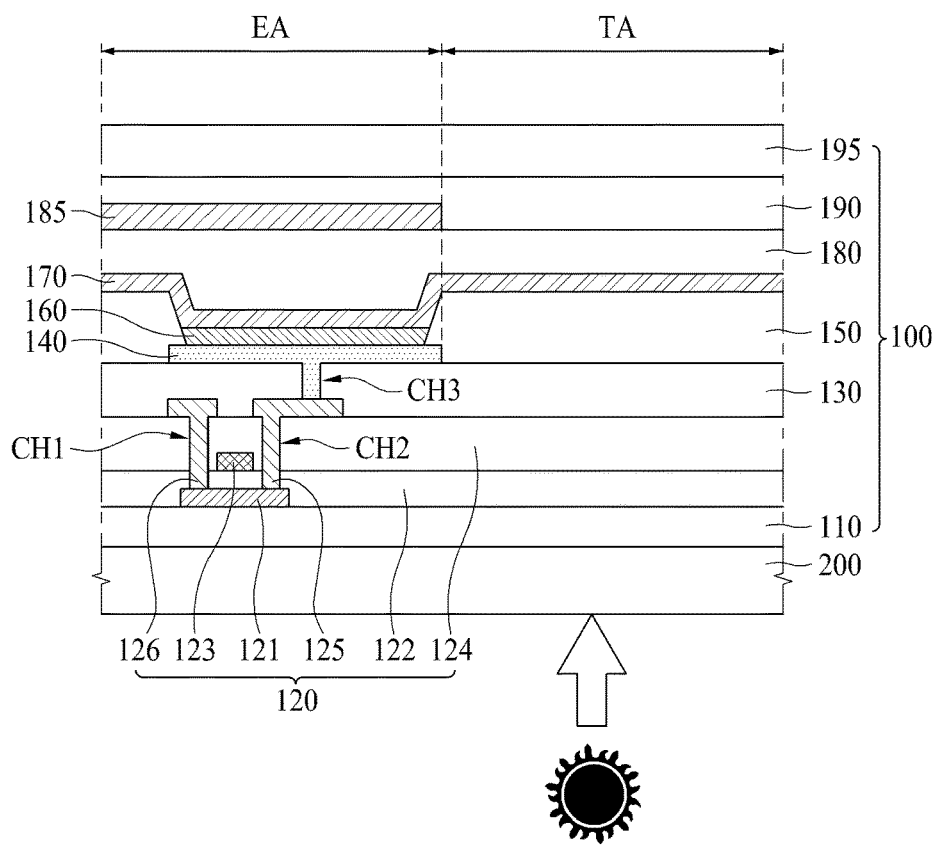
FIG. 2 is a diagram illustrating a stacked structure of a transparent display device including a first display panel and a second display panel according to an aspect of the present disclosure.

FIG. 2 is a diagram illustrating a stacked structure of a transparent display device including a first display panel and a second display panel according to an aspect of the present disclosure.

As illustrated in FIG. 2, the transparent display device according to an aspect of the present disclosure may include a first display panel 100 and a second display panel 200.

The first display panel 100 may include an emissive area EA, where a first pixel including three subpixels is provided, and a transmissive area TA.

The three subpixels may include pixels which respectively emit red light, green light, and blue light, but are not limited thereto. In other aspects, the first pixel may include four pixels which respectively emit red light, green light, blue light, and white light. A detailed description of the first pixel configuring the first display panel 100 will be described below.

As illustrated in FIG. 2, the first display panel 100 of the transparent display device according to an aspect of the present disclosure may include a thin film transistor (TFT) 120, a planarization layer 130, an anode electrode 140, a bank 150, an organic light emitting layer 160, a cathode electrode 170, an encapsulation layer 180, a color filter 185, an overcoat layer 190, and an upper substrate 195 which are provided on a lower substrate 110.

The TFT 120 may include an active layer 121, a first insulation layer 122, a gate electrode 123, a second insulation layer 124, a source electrode 125, and a drain electrode 126.

The active layer 121 may be formed on the lower substrate 110 to overlap the gate electrode 123. The active layer 121 may be formed of a silicon-based semiconductor material, or may be formed of an oxide-based semiconductor material. Although not shown, a light blocking layer may be further provided between the lower substrate 110 and the active layer 121, and in this case, external light incident through a bottom of the lower substrate 110 can be blocked by the light blocking layer, thereby preventing the active layer 121 from being damaged by the external light.

The first insulation layer 122 may be formed on the active layer 121. The first insulation layer 122 may insulate the active layer 121 from the gate electrode 123. The first insulation layer 122 may be formed of an inorganic insulating material (for example, silicon oxide ($SiO_x$), silicon nitride ($SiN_x$), or a multilayer thereof), but is not limited thereto. The first insulation layer 122 may be formed to extend from the emissive area EA to the transmissive area TA.

The gate electrode 123 may be formed on the first insulation layer 122. The gate electrode 123 may be formed to overlap the active layer 121 with the first insulation layer 122 therebetween. The gate electrode 123 may be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof, but is not limited thereto.

The second insulation layer 124 may be formed on the gate electrode 123. The second insulation layer 124 may be formed of an inorganic insulating material (for example, silicon oxide ($SiO_x$), silicon nitride ($SiN_x$), or a multilayer thereof), which is the same as that of the first insulation layer 122, but is not limited thereto. The second insulation layer 124 may be formed to extend from the emissive area EA to the transmissive area TA.

The source electrode 125 and the drain electrode 126 may be formed on the second insulation layer 124 to face each other. The first insulation layer 122 and the second insulation layer 124 may include a first contact hole CH1, exposing one area of the active layer 121, and a second contact hole CH2 which exposes the other area of the active layer 121. Accordingly, the source electrode 125 may be connected to the other area of the active layer 121 through the second contact hole CH2, and the drain electrode 126 may be connected to the one area of the active layer 121 through the first contact hole CH1.

In FIG. 2, the source electrode 125 and the drain electrode 126 are illustrated as being formed of a single layer, but are not limited thereto.

For example, the source electrode 125 may include a bottom source electrode (not shown) and a top source electrode (not shown). The bottom source electrode may be formed between the second insulation layer 124 and the top source electrode to enhance an adhesive force between the second insulation layer 124 and the top source electrode. Also, the bottom source electrode may protect a lower surface of the top source electrode, thereby preventing the lower surface of the top source electrode from being corroded. Therefore, an oxidation rate of the bottom source electrode may be lower than that of the top source electrode. That is, a material of the bottom source electrode may be a material having a corrosion resistance stronger than that of a material of the top source electrode. As described above, the bottom source electrode may act as an adhesion promotor or an anti-corrosion layer and may be formed of an alloy (MoTi) of molybdenum (Mo) and titanium (Ti), but is not limited thereto.

Moreover, the top source electrode may be formed on an upper surface of the bottom source electrode. The top source electrode may be formed of copper (Cu), which is metal having a low resistance, but is not limited thereto. The top source electrode may be formed of metal having a resistance lower than that of the bottom source electrode. In order to decrease a total resistance of the source electrode 125, a thickness of the top source electrode may be formed thicker than that of the bottom source electrode.

Similar to the source electrode 125, the drain electrode 126 may include a bottom drain electrode (not shown) and a top drain electrode (not shown), but is not limited thereto. In other aspects, the source electrode 125 and the drain electrode 126 may each be formed of a multilayer including three or more layers.

A structure of the TFT 120 is not limited to a structure shown in the drawing, and may be variously modified into a structure known to those skilled in the art. For example, in the drawing, the gate electrode 123 is illustrated as having a top gate structure where the gate electrode 123 is formed on the active layer 121, but is not limited thereto. In other aspects, the gate electrode 123 may be formed in a bottom gate structure where the gate electrode 123 is formed under the active layer 121.

The planarization layer 130 may be formed on the TFT 120, and in more detail, may be formed on an upper surface of each of the source electrode 125 and the drain electrode 126. The planarization layer 130 may planarize an upper surface of the lower substrate 110 on which the TFT 120 is provided. The planarization layer 130 may be formed of an organic insulating material such as acryl resin, epoxy resin, phenolic resin, polyamide resin, polyimide resin, and/or the like, but is not limited thereto. The planarization layer 130 may be formed to extend from the emissive area EA to the transmissive area TA.

Although not shown, a passivation layer may be further formed between the TFT 120 and the planarization layer 130 to protect the TFT 120. The passivation layer may be formed of an inorganic insulating material, for example, silicon oxide ($SiO_x$), silicon nitride ($SiN_x$), or a multilayer thereof, but is not limited thereto.

The anode electrode 140 may be formed on the planarization layer 130. The planarization layer 130 may include a third contact hole CH3 which exposes the source electrode 125, and the source electrode 125 may be connected to the anode electrode 140 through the third contract hole CH3.

The anode electrode 140 may reflect the light, emitted from the organic light emitting layer 160, to an upward direction, and thus, the anode electrode 140 may include a material having high reflectivity. Since the transparent display device according to an aspect of the present disclosure transmits external light as-is in a transmissive mode, the anode electrode 140 including the material having high reflectivity may be formed in only the emissive area EA and may not formed in the transmissive area TA. The anode electrode 140 may be formed of a multilayer.

For example, the anode electrode 140 may include a bottom anode electrode (not shown), a top anode electrode (not shown), and a cover anode electrode (not shown). The bottom anode electrode may be formed between the planarization layer 130 and the top anode electrode to enhance an adhesive force between the planarization layer 130 and the top anode electrode. The top anode electrode may be formed between the bottom anode electrode and the cover anode electrode. The top anode electrode may be formed of metal having a resistance which is relatively lower than that of each of the bottom anode electrode and the cover anode electrode. In order to decrease a total resistance of the anode electrode 140, a thickness of the top anode electrode may be formed thicker than that of each of the bottom anode electrode and the cover anode electrode. The cover anode electrode may be formed on the top anode electrode. The cover anode electrode may be formed to cover an upper surface and a side surface of the top anode electrode, thereby preventing the top anode electrode from being corroded. Accordingly, an oxidation rate of the cover anode electrode may be lower than that of the top anode electrode. That is, a material of the cover anode electrode may be a material having a corrosion resistance stronger than that of a material of the top anode electrode.

However, the present aspect is not limited thereto. In other aspects, the anode electrode 140 may be formed of a double layer or a multilayer including four or more layers.

The bank 150 may be formed on both sides of the anode electrode 140 to expose the upper surface of the anode electrode 140. The bank 150 may be formed to expose the upper surface of the anode electrode 140, thereby securing an area on which an image is displayed. Also, since the bank 150 is formed on t both sides of the anode electrode 140, a side surface of the anode electrode 140 vulnerable to corrosion can be prevented from being exposed to the outside, thereby preventing the side surface of the anode electrode 140 from being corroded. In this case, the organic light emitting layer 160 and the cathode electrode 170 may be formed on the upper surface of the anode electrode 140, and thus, an exposed area of the anode electrode 140 where the organic light emitting layer 160 and the cathode electrode 170 are to be formed may correspond to an emissive area.

The bank 150 may be formed of an organic insulating material such as polyimide resin, acryl resin, benzocyclobutene (BCB), and/or the like, but is not limited thereto.

The organic light emitting layer 160 may be formed on the anode electrode 140. The organic light emitting layer 160 may include a hole injecting layer, a hole transporting layer, a light emitting layer, an electron transporting layer, and an electron injecting layer. A structure of the organic light emitting layer 160 may be modified into a structure known to those skilled in the art.

The cathode electrode 170 may be formed on the organic light emitting layer 160. The cathode electrode 170 may be formed on a surface from which light is emitted, and thus, may be formed of a transparent conductive material.

The encapsulation layer 180 may be further formed on the cathode electrode 170. The encapsulation layer 180 is for preventing penetration of external moisture and may use various materials known to those skilled in the art.

The color filter 185 may be formed on the encapsulation layer 180. The color filter 185 may be formed in an area corresponding to each subpixel so as to realize a color of light emitted from the emissive area EA. In this case, white light may be emitted from the organic light emitting layer 160. Since the transparent display device according to an aspect of the present disclosure transmits external light as-is in the transmissive mode, the color filter 185 may be formed in only the emissive area EA and may not be formed in the transmissive area TA. Accordingly, a transmittance of light passing through the transmissive area TA can be prevented from being reduced by the color filter 185.

The overcoat layer 190 may be formed on the color filter 185. Since the color filter 185 is formed in only the emissive area EA, the overcoat layer 190 is for planarizing the lower substrate 110.

As illustrated in FIG. 2, the second display panel 200 may be provided on a first surface of the first display panel 100. The first surface of the first display panel 100 may be a surface which is provided in a direction opposite to a surface on which an image is displayed through the first display panel 100.

The second display panel 200 may include a second pixel which is provided to overlap the emissive area EA and the transmissive area TA of the first display panel 100. The second display panel 200 may control the amount of light incident on the transmissive area TA, based on an operation mode of the first display panel 100.

That is, since the transparent display device according to an aspect of the present disclosure includes the emissive area EA and the transmissive area TA provided in the first display panel 100, a contrast ratio (CR) of an image can be reduced by external light incident from a bottom of the first display panel 100 when displaying an image.

Therefore, when the first display panel 100 operates in a display mode, the second pixel of the second display panel 200 may operate in a light blocking mode to block external light incident on the first display panel 100. When the first display panel 100 operates in the transmissive mode, the second pixel of the second display panel 200 may operate in the transmissive mode to transmit the external light incident on the first display panel 100.

The second display panel 200 may include a liquid crystal panel including a liquid crystal, and in this case, the second display panel 200 may be provided based on one of a twisted nematic (TN) type, an electrically controlled birefringence (ECB) type, a guest host (GH) type, an in-plane switch (IPS) type, and a dynamic scattering (DS) type depending on a structure of a pixel electrode and a common electrode. However, the present aspect is not limited thereto.

Hereinafter, an example of the second display panel 200 of the transparent display device according to an aspect of the present disclosure will be described.

Figure 3:
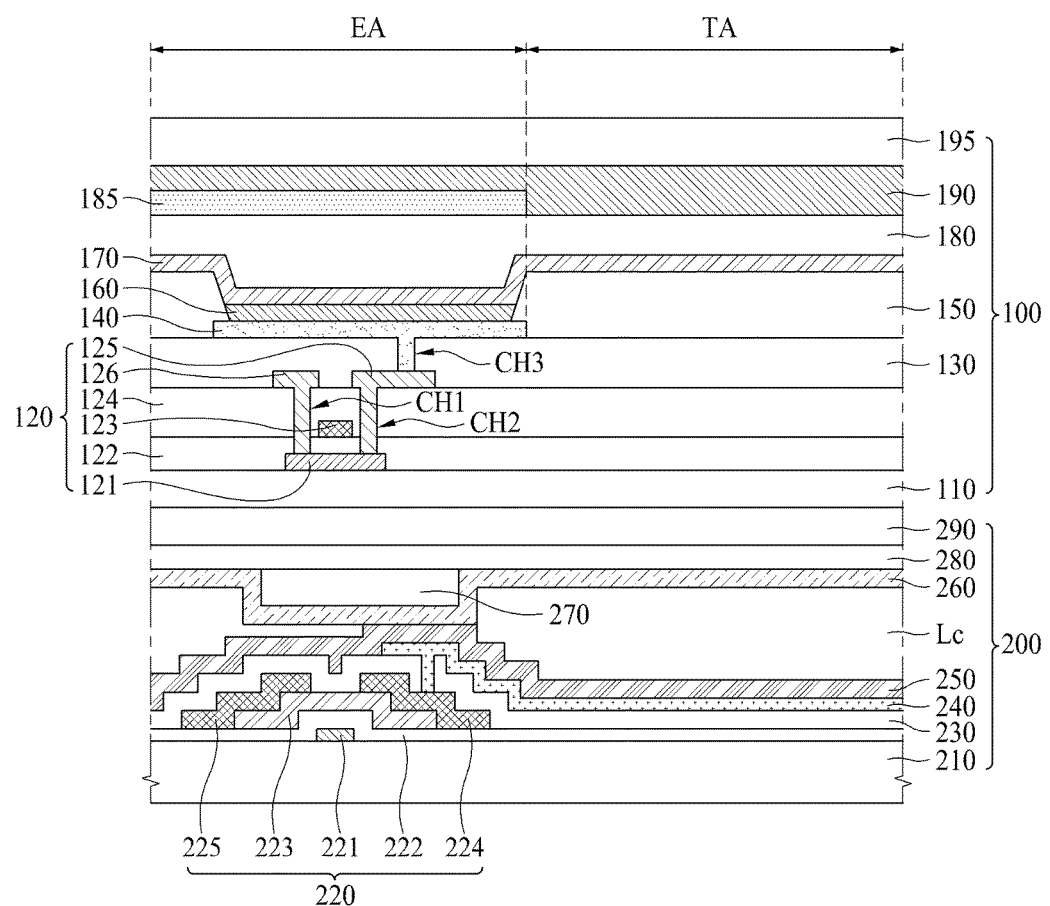
FIG. 3 is a cross-sectional view illustrating a stacked structure of a transparent display device according to an aspect of the present disclosure.

FIG. 3 is a cross-sectional view illustrating a stacked structure of a transparent display device according to an aspect of the present disclosure.

As illustrated in FIG. 3, the second display panel 200 may include a TFT 220, a passivation layer 230, a pixel electrode 240, a bottom alignment layer 250, a top alignment layer 260, a column spacer 270, a common electrode 280, and a second substrate 290 which are provided on a first substrate 210. A liquid crystal layer Lc may be formed in an internal space between the bottom alignment layer 250 and the top alignment layer 260 and may be driven with an electric field generated by a potential difference between the pixel electrode 240 and the common electrode 280, thereby controlling a transmittance of external light.

The second substrate 290 including the top alignment layer 260, the column spacer 270, and the common electrode 280 may be an upper array substrate and may be supplied with a common voltage for controlling a movement of the liquid crystal layer Lc, and the column spacer 270 may maintain a cell gap between the first substrate 210 and the second substrate 290.

The first substrate 210 including the TFT 220, the passivation layer 230, the pixel electrode 240, and the bottom alignment layer 250 may be a lower array substrate and may include a gate electrode 221 which is formed on the first substrate 210 along with a gate line (not shown), a gate insulation layer 222, a semiconductor layer 223 which overlaps the gate electrode 221 with the gate insulation layer 222 therebetween, and a drain electrode 224 and a source electrode 225 which are formed with the semiconductor layer 223 therebetween along with a data line (not shown).

The passivation layer 230 may be formed between the TFT 220 and the pixel electrode 240 to protect the TFT 220.

The TFT 220 may supply a pixel signal of the data line to the pixel electrode 240 in response to a scan signal supplied through the gate line. The pixel electrode 240 may be formed of a transparent conductive material having a high light transmittance and may be connected to the drain electrode 224 through a fourth contact hole CH4 which is formed in the passivation layer 230.

The bottom alignment layer 250 and the top alignment layer 260 align the liquid crystal layer Lc. An alignment material such as polyimide may be coated, and then, by performing a rubbing process, the bottom alignment layer 250 and the top alignment layer 260 can be formed.

When the second display panel 200 according to an aspect of the present disclosure is implemented as a liquid crystal panel, a structure of the liquid crystal panel is not limited to the above description. That is, when the liquid crystal panel is implemented as an IPS type using a lateral electric field, the common electrode 280 may be formed on the first substrate 210 corresponding to the lower array substrate.

As described above, since the transparent display device according to an aspect of the present disclosure includes the second display panel 200 provided on the first surface of the first display panel 100 including the emissive area EA and the transmissive area TA, external light incident on the first display panel 100 is blocked in the display mode of the first display panel 100. Accordingly, the transparent display device according to an aspect of the present disclosure blocks light incident on the transparent display device even in the outside environment having high illumination, thereby preventing a visibility of black from being reduced.

Moreover, the second display panel 200 of the transparent display device according to an aspect of the present disclosure may be implemented to emit white light by using external light, such as sunlight, as a backlight.

That is, by blocking external light which is incident on the first display panel 100 through the second display panel 200, a reduction in visibility of black can be prevented to some degree. However, since sunlight has luminance much higher than that of light emitted from the first display panel 100, it may be difficult to recognize an image through the transparent display device at an outdoor place. Accordingly, in an aspect of the present disclosure, since the second display panel 200 uses external light, such as sunlight, as a backlight, a luminance of white increases, thereby improving a contrast ratio.

To this end, the TFT 220 of the second display panel 200 may be disposed to overlap the emissive area of the first display panel 100, and the pixel electrode 240 of the second display panel 200 may be disposed to overlap the transmissive area TA of the first display panel 100.

As described above, the first display panel 100 of the transparent display device according to an aspect of the present disclosure may include the anode electrode 140 in order for the emissive area EA to reflect light in an up direction. Therefore, in an aspect of the present disclosure, since the TFT 220 of the second display panel 200 which reduces a transmittance of external light is provided to overlap the emissive area EA, a light transmittance of the transparent display device is prevented from being reduced by the TFT 220. Also, a stacked structure of the first display panel 100 and the second display panel 200 of the transparent display device according to an aspect of the present disclosure is not limited to the above description. For example, each of the lower substrate 110 of the first display panel 100 and the second substrate 290 of the second display panel 200 may not be provided as a separate element. That is, the transparent display device according to an aspect of the present disclosure may include only one substrate where the lower substrate 110 of the first display panel 100 is bonded to the second substrate 290 of the second display panel 200, or may be implemented by omitting the lower substrate 110 and the second substrate 290. In this case, the first substrate 210 of the second display panel 200 may be a lower substrate of the whole transparent display device, and the upper substrate 195 of the first display panel 100 may be an upper substrate of the whole transparent display device, thereby decreasing the manufacturing cost of the transparent display device.

Moreover, the pixel electrode 240 of the second display panel 200 may be provided to overlap the transmissive area TA of the first display panel 100 so that the second display panel 200 uses external light, such as sunlight, as a backlight, and thus, the transmissive area TA emits white light. Accordingly, the liquid crystal layer Lc may be driven with an electric field generated by a potential difference between the pixel electrode 240 and the common electrode 280 provided on a front surface of the second display panel 200, and thus, the transmissive area TA may emit white light through the second display panel 200.

Hereinafter, a pixel structure of each of the first display panel 100 and the second display panel 200 of the transparent display device according to an aspect of the present disclosure which is implemented to emit white light through the second display panel 200 will be described.

Figure 4A:
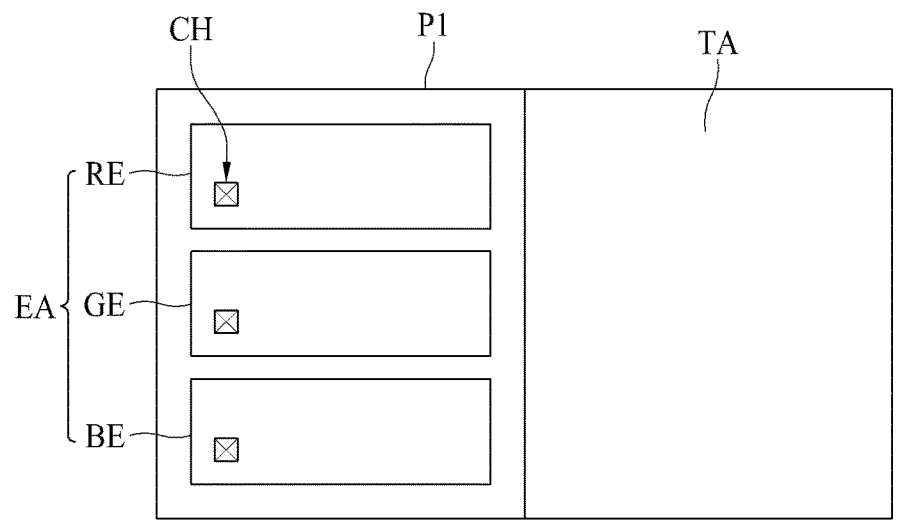
FIGS. 4A and 4B are plan views schematically illustrating one pixel of each of the first display panel and the second display panel of the transparent display device according to an aspect of the present disclosure.
Figure 4B:
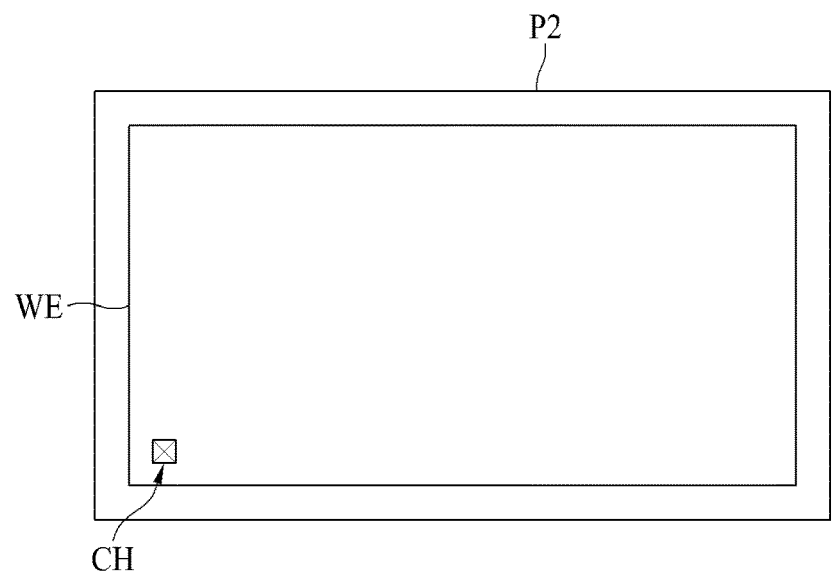

FIGS. 4A and 4B are plan views schematically illustrating one pixel of each of the first display panel and the second display panel of the transparent display device according to an aspect of the present disclosure.

Figure 5A:
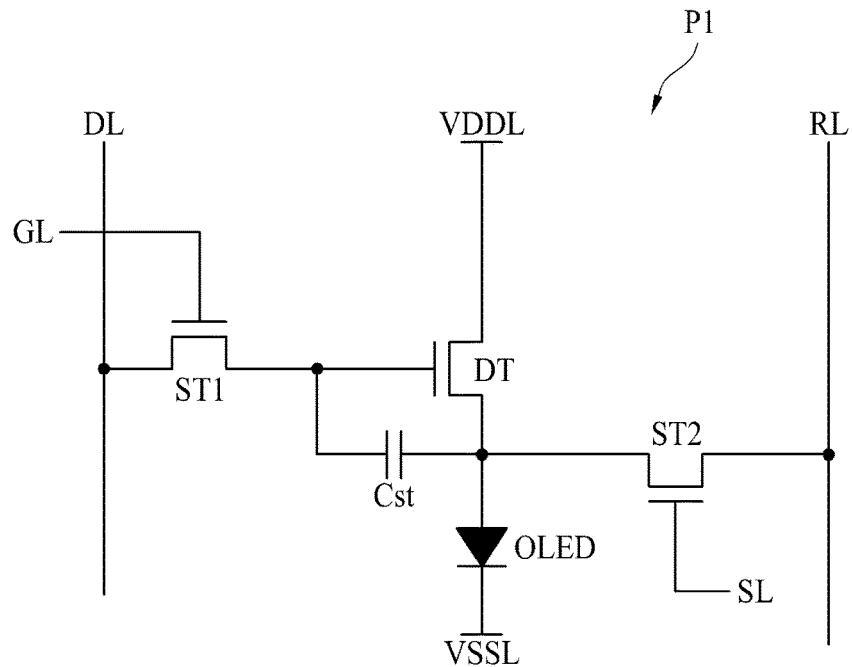
FIGS. 5A and 5B are diagrams illustrating a circuit configuration of one pixel of each of the first display panel and the second display panel.
Figure 5B:
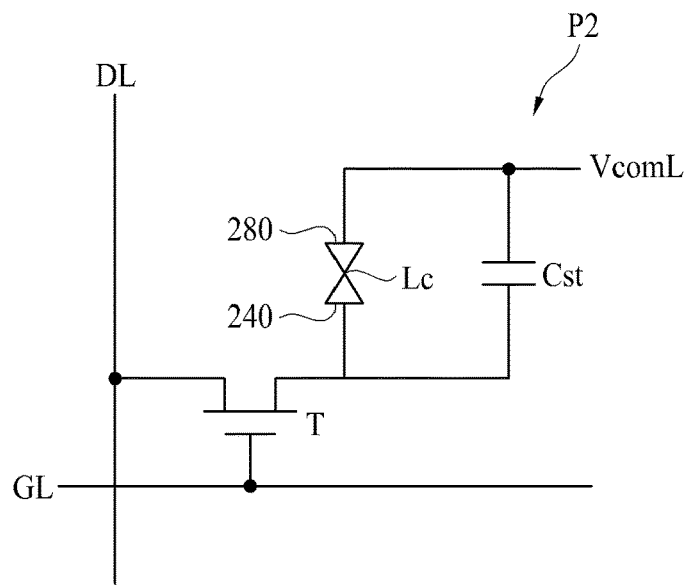

FIGS. 5A and 5B are diagrams illustrating a circuit configuration of one pixel of each of the first display panel and the second display panel.

FIG. 4A is a plan view schematically illustrating a structure of a first pixel P1 of the first display panel 100 of the transparent display device according to an aspect of the present disclosure, and FIG. 5A is a diagram illustrating a circuit configuration of one subpixel of the first pixel P1.

FIG. 4B is a plan view schematically illustrating a structure of a second pixel P2 of the second display panel 200 of the transparent display device according to an aspect of the present disclosure, and FIG. 5B is a diagram illustrating a circuit configuration of the second pixel P2.

As described above, since the first display panel 100 of the transparent display device according to an aspect of the present disclosure includes the emissive area EA and the transmissive area TA, a viewer can watch an image through the emissive area EA and can see a rear scene or an object located behind the first display panel 100 through the transmissive area TA.

The first pixel P1 may be provided in the emissive area EA and may include a plurality of subpixels. In FIG. 4A, an example where the first pixel P1 includes a red light emitting pixel RE emitting red light, a green light emitting pixel GE emitting green light, and a blue light emitting pixel BE emitting blue light is illustrated, but the present aspect is not limited thereto. In other aspects, the first pixel P1 may further include a white light emitting pixel emitting white light. Each of the red light emitting pixel RE, the green light emitting pixel GE, and the blue light emitting pixel BE may be defined as an anode electrode, which is individually provided in each subpixel. That is, the red light emitting pixel RE, the green light emitting pixel GE, and the blue light emitting pixel BE illustrated in FIG. 4A may denote anode electrodes respectively emitting red light, green light, and blue light and may each operate according to a driving signal supplied through a contact hole CH from a TFT.

Referring to FIGS. 4A and 5A, each of the red light emitting pixel RE, the green light emitting pixel GE, and the blue light emitting pixel BE may include an organic light emitting diode OLED, a driving transistor DT, first and second transistors ST1 and ST2, and a capacitor Cst.

The organic light emitting diode OLED may emit light with a current supplied through the driving transistor DT. An anode electrode of the organic light emitting diode OLED may be connected to a source electrode of the driving transistor DT, and a cathode electrode may be connected to a first source voltage line VSSL through which a first source voltage is supplied. The first source voltage line VSSL may be a low-level voltage line through which a low-level source voltage is supplied.

The organic light emitting diode OLED may include an anode electrode, a hole transporting layer, an organic light emitting layer, an electron transporting layer, and a cathode electrode. When a voltage is applied to the anode electrode and the cathode electrode, a hole and an electron may move to the organic light emitting layer through the hole transporting layer and the electron transporting layer and may be combined with each other in the organic light emitting layer to emit light.

The driving transistor DT may be disposed between the organic light emitting diode OLED and a second source voltage line VDDL through which a second source voltage is supplied. The driving transistor DT may control a current flowing from the second source voltage line VDDL to the organic light emitting diode OLED, based on a voltage difference between a gate electrode and a source electrode of the driving transistor DT. The gate electrode of the driving transistor DT may be connected to a first electrode of the first transistor ST1, a source electrode may be connected to the anode electrode of the organic light emitting diode OLED, and a drain electrode may be connected to the second source voltage line VDDL. The second source voltage line VDDL may be a high-level voltage line through which a high-level source voltage is supplied.

The first transistor ST1 may be turned on by a gate signal of a gate line GL and may supply a voltage of a data line DL to the gate electrode of the driving transistor DT. The gate electrode of the first transistor ST1 may be connected to the gate line GL, the first electrode of the first transistor ST1 may be connected to the gate electrode of the driving transistor DT, and a second electrode of the first transistor ST1 may be connected to the data line DL.

The second transistor ST2 may be turned on by an initialization signal of an initialization line SL and may connect a reference voltage line RL to the source electrode of the driving transistor DT. The gate electrode of the second transistor ST2 may be connected to the initialization line SL, a first electrode of the second transistor ST2 may be connected to the reference voltage line RL, and a second electrode of the second transistor ST2 may be connected to the source electrode of the driving transistor DT.

The first electrode of each of the first and second transistors ST1 and ST2 may be a source electrode, and the second electrode may be a drain electrode. However, the present aspect is not limited thereto. That is, the first electrode of each of the first and second transistors ST1 and ST2 may be a drain electrode, and the second electrode may be a source electrode.

The capacitor Cst may be provided between the gate electrode and the source electrode of the driving transistor DT. The capacitor Cst may store a difference voltage between the gate electrode and the source electrode of the driving transistor DT.

As described above, since each of the red light emitting pixel RE, the green light emitting pixel GE, and the blue light emitting pixel BE according to an aspect of the present disclosure includes three transistors DT, ST1, and ST2 and the capacitor Cst provided in the emissive area EA, the data line DL, the gate line GL, the source voltage lines VDDL and VSSL, and the reference voltage line connected to the three transistors DT, ST1, and ST2 may be provided in the emissive area EA. Accordingly, in the first display panel 100, since elements that can reduce a transmittance of the emissive area EA are all provided in the emissive area EA, a high aperture ratio can be maintained.

Referring to FIGS. 4B and 5B, the second display panel 200 may include a second pixel P2 which is provided to overlap the emissive area EA and the transmissive area TA of the first display panel 100. The second pixel P2 of the second display panel 200 may be configured with only one subpixel WE emitting white light. That is, the second pixel P2 of the second display panel 200 may include only a white light emitting pixel WE. The white light emitting pixel WE may be provided to overlap all of the red light emitting pixel RE, the green light emitting pixel GE, and the blue light emitting pixel BE of the first display panel 100. Moreover, the white light emitting pixel WE may be provided to overlap the transmissive area TA of the first display panel 100. The white light emitting pixel WE may be defined as a pixel electrode which is individually provided in each pixel P2. That is, the white light emitting pixel WE illustrated in FIG. 4B may denote a pixel electrode for emitting white light and may operate according to a driving signal supplied through a contact hole CH from a TFT.

Therefore, the second display panel 200 of the transparent display device according to an aspect of the present disclosure may emit white light in the transmissive area TA of the first display panel 100 by using external light such as sunlight to improve luminance, thereby enhancing a contrast ratio (CR) of an image displayed through the transparent display device.

Referring to FIGS. 4B and 5B, the white light emitting pixel WE may include a transistor T, a pixel electrode 240, a common electrode 280, a liquid crystal layer Lc, and a capacitor Cst.

The transistor T may supply a data voltage of a data line DL to the pixel electrode 240 in response to a gate signal of a gate line GL. The common electrode 280 may be supplied with a common voltage through a common voltage line VcomL. Therefore, the white light emitting pixel WE may drive a liquid crystal of the liquid crystal layer Lc with an electric field generated by a potential difference between the data voltage supplied to the pixel electrode 240 and the common voltage supplied to the common electrode 280, thereby controlling a transmittance of external light such as sunlight.

The capacitor Cst may be provided between the pixel electrode 240 and the common electrode 280 to hold a constant voltage difference between the pixel electrode 240 and the common electrode 280.

As described above, the white light emitting pixel WE according to an aspect of the present disclosure may include one transistor T and the capacitor Cst, the transistor T and the capacitor Cst may be provided to overlap the emissive area EA of the first display panel 100, and lines such as the data line DL and the gate line GL connected to the transistor T may be provided to overlap the emissive area EA of the first display panel 100. Accordingly, the second display panel 200 may emit white light without affecting an aperture ratio of the first display panel 100, thereby improving a contrast ratio of an image displayed by the first display panel 100.

Moreover, the pixel electrode 240 of the second display panel 200 may be provided to overlap the transmissive area TA of the first display panel 100. That is, since the pixel electrode 240 is provided to overlap the transmissive area TA of the first display panel 100, the transmissive area TA may emit white light based on external light such as sunlight.

Moreover, the pixel electrode 240 of the second display panel 200 may be provided to overlap the emissive area EA of the first display panel 100. In this case, the pixel electrode 240 of the second display panel 200 may be provided not to overlap the red light emitting pixel RE, the green light emitting pixel GE, and the blue light emitting pixel BE which configure the first pixel P1 of the first display panel 100.

That is, with respect to a plane, an area corresponding to the red light emitting pixel RE, the green light emitting pixel GE, and the blue light emitting pixel BE and an area corresponding to the white light emitting pixel WE of the second display panel 200 may be provided in the emissive area EA of the first display panel 100. In this case, although not shown, an area, corresponding to the white light emitting pixel WE of the second display panel 200, of the emissive area EA of the first display panel 100 may be provided to transmit the white light of the white light emitting pixel WE as-is. Accordingly, the first pixel P1 of the first display panel 100 may emit red light, green light, and blue light, and the second pixel P2 of the second display panel 200 may emit white light.

Figure 6:
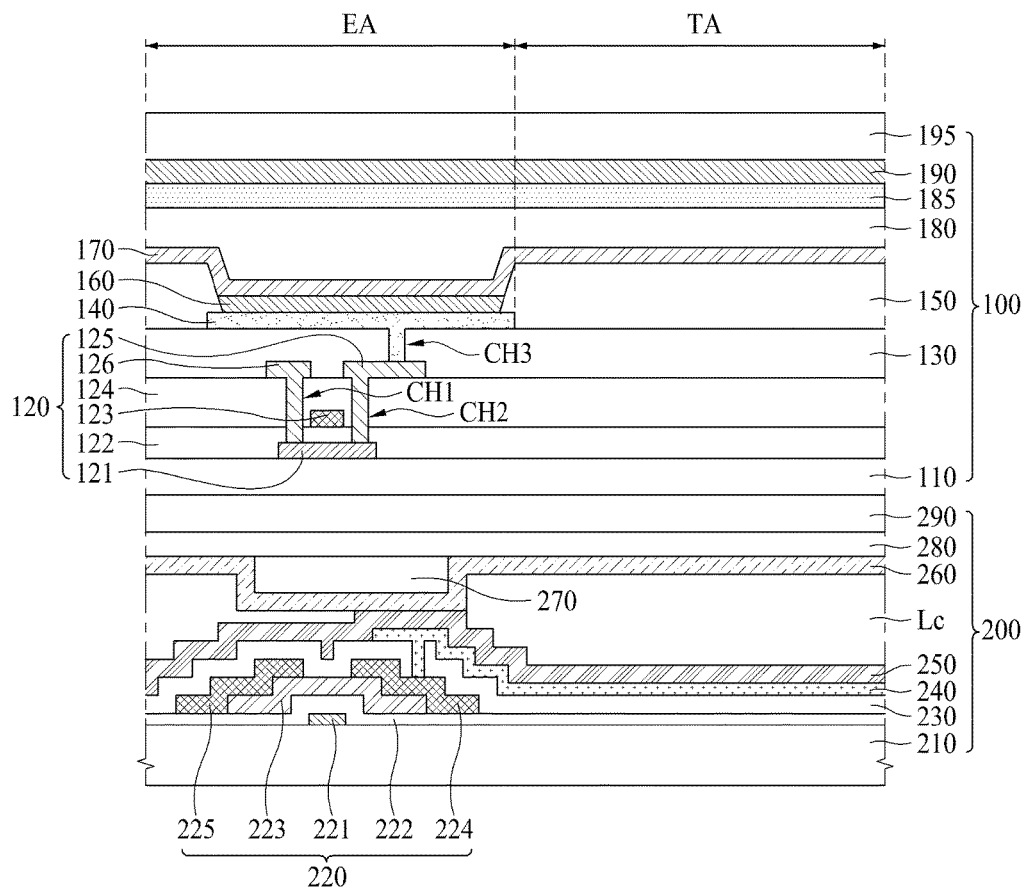
FIG. 6 is a cross-sectional view illustrating in detail a stacked structure of a first display panel and a second display panel of a transparent display device according to another aspect of the present disclosure.

FIG. 6 is a cross-sectional view illustrating in detail a stacked structure of a first display panel and a second display panel of a transparent display device according to another aspect of the present disclosure.

Except that a color filter is provided to extend to a transmissive area, as illustrated in FIG. 6, the transparent display device according to another aspect of the present disclosure is the same as the transparent display device illustrated in FIGS. 2 and 3. Thus, like reference numerals refer to like elements, and only different elements will be described below.

As illustrated in FIG. 6, the transparent display device according to another aspect of the present disclosure may include a first display panel 100 and a second display panel 200.

The first display panel 100 may include a first pixel which is provided in plurality. Each of the plurality of first pixels may include an emissive area EA, where three subpixels are provided, and a transmissive area TA.

Particularly, the first display panel 100 of the transparent display device according to another aspect of the present disclosure may include a color filter 185 which is provided to extend from the emissive area EA to the transmissive area TA.

Moreover, the second display panel 200 may include a second pixel which is provided to overlap the color filter 185 in the transmissive area TA, and the second pixel may emit red light, green light, and blue light along with the first display panel 100.

As described above, in another aspect of the present disclosure, the second display panel 200 may display an image by using external light such as sunlight, thereby improving a contrast ratio and image quality.

Hereinafter, a structure of the second display panel 200 for emitting red light, green light, and blue light in the transmissive area TA of the first display panel 100 will be described in detail.

Figure 7A:
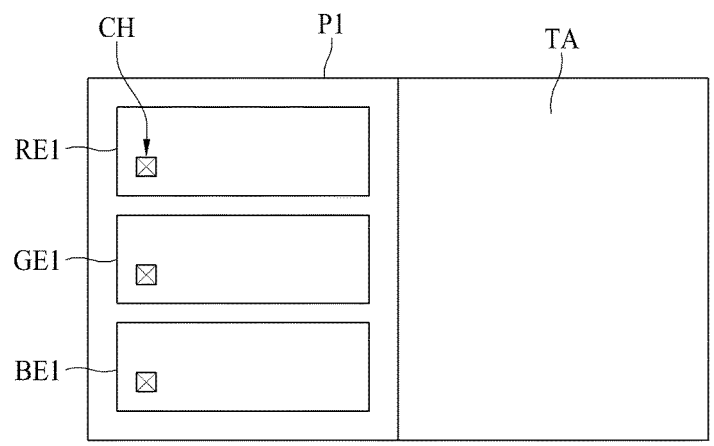
FIGS. 7A and 7B are plan views schematically illustrating one pixel of each of the first display panel and the second display panel of the transparent display device according to another aspect of the present disclosure.
Figure 7B:
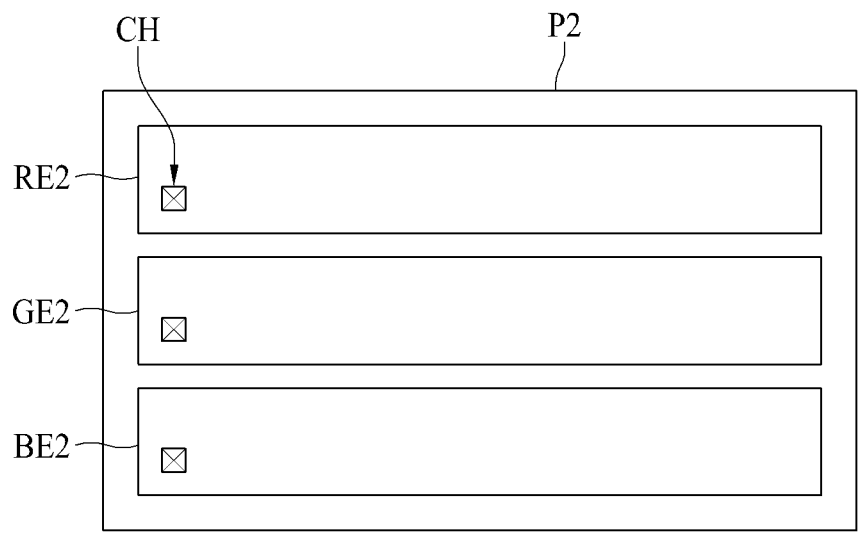

FIGS. 7A and 7B are plan views schematically illustrating one pixel of each of the first display panel and the second display panel of the transparent display device according to another aspect of the present disclosure.

FIG. 7A is a plan view schematically illustrating a structure of a first pixel P1 of a first display panel 100 of a transparent display device according to another aspect of the present disclosure, and FIG. 7B is a plan view schematically illustrating a structure of a second pixel P2 of a second display panel 200 of the transparent display device according to another aspect of the present disclosure. Except that the second pixel includes subpixels equal to the number of subpixels of the first pixel of the first display panel 100 in order for a gray level to be realized in the second display panel 200, as illustrated in FIGS. 7A and 7B, the transparent display device according to another aspect of the present disclosure is the same as the transparent display device illustrated in FIGS. 4A and 4B. Thus, like reference numerals refer to like elements, and only different elements will be described below.

As described above, since the first display panel 100 of the transparent display device according to another aspect of the present disclosure includes an emissive area EA and a transmissive area TA, a viewer can watch an image through the emissive area EA and can see a rear scene or an object located behind the first display panel 100 through the transmissive area TA.

The second display panel 200 of the transparent display device according to another aspect of the present disclosure may include a second pixel P2 which is provided to overlap the emissive area EA and the transmissive area TA of the first display panel 100. The second pixel P2 may include subpixels equal to the number of subpixels included in the first pixel P1 of the first display panel 100. That is, the second pixel P2 may include a red light emitting pixel RE2 emitting red light, a green light emitting pixel GE2 emitting green light, and a blue light emitting pixel BE2 emitting blue light.

Each of the red light emitting pixel RE2, the green light emitting pixel GE2, and the blue light emitting pixel BE2 may be defined as a pixel electrode which is individually provided in each subpixel. In other words, the red light emitting pixel RE2, the green light emitting pixel GE2, and the blue light emitting pixel BE2 illustrated in FIG. 7B may denote pixel electrodes respectively emitting red light, green light, and blue light and may each operate according to a driving signal supplied through a contact hole CH from a TFT.

To this end, the red light emitting pixel RE2, the green light emitting pixel GE2, and the blue light emitting pixel BE2 of the second display panel 200 may be provided to overlap the transmissive area TA as well as the emissive area EA of the first display panel 100. Accordingly, the red light emitting pixel RE2, the green light emitting pixel GE2, and the blue light emitting pixel BE2 of the second display panel 200 may respectively emit red light, green light, and blue light in the transmissive area TA to display an image, thereby improving image quality.

That is, a pixel electrode 240 of each of the red light emitting pixel RE2, the green light emitting pixel GE2, and the blue light emitting pixel BE2 of the second display panel 200 may be provided to overlap the transmissive area TA of the first display panel 100, and thus, red light, green light, and blue light may be realized in the transmissive area TA by using external light such as sunlight.

As described above, the first display panel 100 of the transparent display device according to another aspect of the present disclosure may include a color filter 185 which is provided to extend from the emissive area EA to the transmissive area TA, and thus, the second display panel 200 may not include a separate color filter.

In FIGS. 7A and 7B, the first pixel P1 of the first display panel 100 and the second pixel P2 of the second display panel 200 are illustrated as including the subpixels respectively emitting red light, green light, and blue light, but the present aspect is not limited thereto. In other aspects, the first pixel P1 of the first display panel 100 and the second pixel P2 of the second display panel 200 may include four subpixels respectively emitting red light, green light, blue light, and white light.

Figure 8:
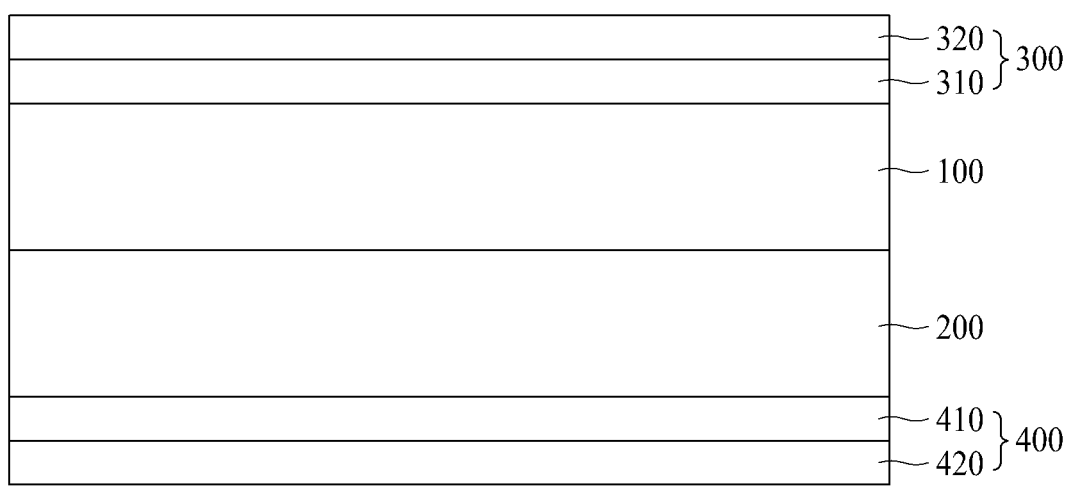
FIG. 8 is a diagram schematically illustrating a stacked structure of a transparent display device according to another aspect of the present disclosure.

FIG. 8 is a diagram schematically illustrating a stacked structure of a transparent display device according to another aspect of the present disclosure.

Except that the transparent display device according to another aspect of the present disclosure further includes at least one of a first anti-reflection part 300 and a second anti-reflection part 400, as illustrated in FIG. 8, the transparent display device according to another aspect of the present disclosure may be the same as the transparent display device illustrated in FIGS. 2 and 3. Thus, like reference numerals refer to like elements, and only different elements will be described below.

The first anti-reflection part 300 may be provided on a second surface of the first display panel 100 opposite to the first surface on which the second display panel 200 is provided. The first anti-reflection part 300 prevents an external leakage of light incident through the second surface of the first display panel 100.

The first anti-reflection part 300 may include a first phase delay layer 310, which is provided on the second surface of the first display panel 100 to delay a phase by $\lambda/4$, and a first linear polarization layer 320 which is provided on a second surface of the first phase delay layer 310. In this case, the second surface of the first display panel 100 and the second surface of the first phase delay layer 310 may be surfaces which face the same direction. That is, if the first anti-reflection part 300 is provided on an upper surface of the first display panel 100, the second surface may denote an upper surface, and thus, the first phase delay layer 310 may be provided on the upper surface of the first display panel 100 and the first linear polarization layer 320 may be provided on an upper surface of the first phase delay layer 310.

The first phase delay layer 310 and the first linear polarization layer 320 may absorb all of light incident on the transparent display device so as not to be leaked to the outside, for preventing a visibility of black from being reduced when the light incident on the transparent display device is reflected by the first display panel 100. Therefore, the first phase delay layer 310 may be formed of a quarter wave plate (QWP) that delays a phase by $\lambda/4$. An operation relationship where all of incident light is absorbed by the first phase delay layer 310 and the first linear polarization layer 320 is as follows.

The first phase delay layer 310 and the first linear polarization layer 320 may be sequentially formed on the first display panel 100, and thus, the light incident on the transparent display device may first pass through the first linear polarization layer 320 and may subsequently pass through the first phase delay layer 310.

When external light is incident on the transparent display device, the external light may pass through the first linear polarization layer 320 and thus may be linearly polarized to light (first light) which vibrates in a direction parallel to a transmissive axis of the first linear polarization layer 320, and the first light obtained through the linear polarization may pass through the first phase delay layer 310 and thus may be circularly polarized to light (second light) having a certain rotation direction. Also, the second light obtained through the circular polarization may be reflected by a metal electrode or a line provided in the first display panel 100 and thus may have a changed rotation direction (converted into third light), and the third light may pass through the first phase delay layer 310 and thus may be linearly polarized to four light. In this case, a vibration direction of the four light obtained through the linear polarization is vertical to the transmissive axis of the first linear polarization layer 320, and thus, all of the four light may be absorbed by the first linear polarization layer 320 without passing through the first linear polarization layer 320.

That is, all of light incident on the transparent display device may be blocked by a polarization operation of the linear polarization layer 320 and the first phase delay layer 310 and may not be leaked to the outside, thereby preventing a visibility of black of the transparent display device from being reduced.

Moreover, the transparent display device according to another aspect of the present disclosure may include a second anti-reflection part 400 which is provided on the second surface of the second display panel 200 to prevent an external leakage of light incident through the second surface of the second display panel 200. The second surface of the second display panel 200 may be a surface which is provided in a direction opposite to a first surface facing the first display panel 100.

The second anti-reflection part 400 may include a second phase delay layer 410, which is provided on the second surface of the second display panel 200 to delay a phase by $-\lambda/4$, and a second linear polarization layer 420 which is provided on the second surface of the second phase delay layer 410. In this case, the second surface of the second display panel 200 and the second surface of the second phase delay layer 410 may be surfaces which face the same direction. That is, if the second anti-reflection part 400 is provided on a lower surface of the second display panel 200, the second surface may denote a lower surface, and thus, the second phase delay layer 410 may be provided on the lower surface of the second display panel 200 and the second linear polarization layer 420 may be provided on a lower surface of the second phase delay layer 410.

The second phase delay layer 410 and the second linear polarization layer 420 may absorb all of light incident on the transparent display device so as not to be leaked to the outside, for preventing a visibility of black from being reduced when the light incident on the transparent display device is reflected by the first display panel 100. Therefore, the second phase delay layer 410 may be formed of a quarter wave plate (QWP) that delays a phase by $-\lambda/4$. An operation relationship where all of incident light is absorbed by the second phase delay layer 410 and the second linear polarization layer 420 is the same as that of the first anti-reflection part 300.

In another aspect of the present disclosure, since the first anti-reflection part 300 is provided on the second surface of the first display panel 100 and the second anti-reflection part 400 is provided on the second surface of the second display panel 200, all of external light incident on the inside of the transparent display device through the second surface of the first display panel 100 or the second surface of the second display panel 200 may be absorbed, thereby preventing a visibility of black from being reduced.

As described above, according to the aspects of the present disclosure, the first display panel may display an image, and the second display panel may block external light, thereby solving a problem where it is difficult to recognize the image due to the external light.

Moreover, according to the aspects of the present disclosure, the second display panel may realize a gray level of each of red, green, blue, and white by using external light, thereby preventing a contrast ratio from being reduced and improving image quality.

Moreover, according to the aspects of the present disclosure, the anti-reflection device may be additionally provided on at least one surface of each of the first display panel and the second display panel, thereby preventing a leakage of external light incident on each of the first display panel and the second display panel.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A transparent display device comprising:
a first display panel including a transmissive area and an emissive area where a first pixel including a plurality of subpixels displaying an image is provided, and including a plurality of color filters and disposed corresponding to the plurality of subpixels in the emissive area and extended to the transmissive area;
a second display panel including a second pixel overlapping the emissive area and the transmissive area of the first display panel and a liquid crystal layer disposed only in the transmissive area of the first display panel; and
a first anti-reflection part disposed on a second surface of the first display panel and preventing light reflecting back to outside;
wherein the liquid crystal layer of the second display panel vertically overlaps the color filters extended to the transmissive area and does not vertically overlap the color filters in the emissive area, and
wherein the second display panel is disposed on a first surface of the first display panel and the second pixel of the second display panel has the number of subpixels the same as the plurality of subpixels in the first pixel of the first display panel.

2. The transparent display device of claim 1, wherein the second pixel of the second display panel controls an amount of light incident into the first display panel.

3. The transparent display device of claim 2, wherein the second pixel of the second display panel blocks external light incident into the first display panel when the first display panel operates in a display mode, and the second pixel of the second display panel allows the external light transmit through the first display panel when the first display panel operates in a transmissive mode.

4. The transparent display device of claim 3, wherein the second pixel of the second display panel comprises:
a thin film transistor, a pixel electrode, a common electrode, and the liquid crystal layer between the pixel electrode and the common electrode,
wherein an alignment direction of the liquid crystal layer is changed based on a voltage difference between a voltage applied to the pixel electrode and a voltage applied to the common electrode, thereby blocking or transmitting the external light through the liquid crystal layer.

5. The transparent display device of claim 4, wherein the thin film transistor of the second display panel overlaps the emissive area of the first display panel.

6. The transparent display device of claim 4, wherein the pixel electrode of the second display panel overlaps the transmissive area of the first display panel.

7. The transparent display device of claim 6, wherein the pixel electrode of the second display panel overlaps the emissive area of the first display panel.

8. The transparent display device of claim 4, wherein each of the subpixels in the second pixel of the second display panel comprises a transistor, a pixel electrode, and a common electrode, and the pixel electrode overlaps a corresponding color filter of the plurality of color filters in the transmissive area.

9. The transparent display device of claim 1, further comprising a second anti-reflection part disposed on the second surface of the second display panel facing the first display panel and preventing light reflecting back to outside.

10. The transparent display device of claim 9, wherein the first anti-reflection part comprises:
a first phase delay layer disposed on the second surface of the first display panel and delaying a phase by $\lambda/4$; and
a first linear polarization layer disposed on the second surface of the first phase delay layer.

11. The transparent display device of claim 9, wherein the second anti-reflection part comprises:
a second phase delay layer disposed on the second surface of the second display panel and delaying a phase by $-\lambda/4$; and
a second linear polarization layer on the second surface of the second phase delay layer.

12. A transparent display device including a transmissive area and an emissive area comprising:
a first display panel including a first pixel including a plurality of subpixels displaying an image and including a plurality of color filters disposed corresponding to the first pixel in the emissive area and extended to the transmissive area;

a second display panel including a second pixel, disposed on the first display panel, vertically overlapping the first display panel at the emissive area and the transmissive area, having a liquid crystal layer disposed only in the transmissive area of the first display panel, and configured to control an amount of light incident into the first display panel; and a first anti-reflection part disposed on the first display panel and preventing light reflecting back to outside, wherein the liquid crystal layer of the second display panel vertically overlaps the color filters extended to the transmissive area and does not vertically overlap the color filters in the emissive area, and wherein the second pixel of the second display panel has the number of subpixels the same as the plurality of subpixels in the first pixel of the first display panel.

13. The transparent display device of claim 12, wherein the second pixel controls the amount of light by blocking external light incident into the first display panel when the first display panel operates in a display mode and allowing the external light to transmit through the first display panel when the first display panel operates in a transmissive mode.

14. The transparent display device of claim 13, wherein the second pixel comprises a thin film transistor, a pixel electrode, a common electrode, and the liquid crystal layer between the pixel electrode and the common electrode, and blocks or allows transmission of the external light by changing an alignment direction of the liquid crystal layer of the second display panel based on a voltage difference between a voltage applied to the pixel electrode and a voltage applied to the common electrode.

15. The transparent display device of claim 12, further comprising a second anti-reflection part disposed on the second display panel and preventing light reflecting back to outside.

16. The transparent display device of claim 4, further a top alignment layer on the common electrode and a bottom alignment layer on the pixel electrode, wherein the top alignment layer and the bottom alignment layer face the liquid crystal layer.

17. The transparent display device of claim 16, further comprising a column spacer maintaining a cell in the second display panel, wherein the column spacer is disposed between the common electrode and the top alignment layer and overlaps the thin film transistor.

\* \* \* \* \*